US012401112B2

(12) United States Patent
Oh et al.

(10) Patent No.: US 12,401,112 B2
(45) Date of Patent: Aug. 26, 2025

(54) ELECTRONIC APPARATUS FOR STABLE ELECTRICAL CONNECTION

(71) Applicant: SAMSUNG ELECTRONICS CO., LTD., Suwon-si (KR)

(72) Inventors: Myeongsu Oh, Suwon-si (KR); Yongyoun Kim, Suwon-si (KR); Duho Chu, Suwon-si (KR); Youngjune Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 147 days.

(21) Appl. No.: 18/375,179

(22) Filed: Sep. 29, 2023

(65) Prior Publication Data

US 2024/0030590 A1 Jan. 25, 2024

Related U.S. Application Data

(63) Continuation of application No. PCT/KR2022/003839, filed on Mar. 18, 2022.

(30) Foreign Application Priority Data

Apr. 12, 2021 (KR) .......................... 10-2021-0046941

(51) Int. Cl.
*H01Q 1/24* (2006.01)
*H01Q 1/48* (2006.01)
(Continued)

(52) U.S. Cl.
CPC ............... *H01Q 1/243* (2013.01); *H01Q 1/48* (2013.01); *H04M 1/0216* (2013.01);
(Continued)

(58) Field of Classification Search
CPC ....... H01Q 1/243; H01Q 1/48; H04M 1/0216; H04M 1/0268; H04M 1/0277; H05K 1/0243; H05K 7/1427; H05K 2201/10098
See application file for complete search history.

(56) References Cited

U.S. PATENT DOCUMENTS 8,766,859 B2 7/2014 Merz et al.
8,836,587 B2 9/2014 Darnell et al.
(Continued)

FOREIGN PATENT DOCUMENTS

CN 103178343 A 6/2013
CN 107660063 A 2/2018
(Continued)

OTHER PUBLICATIONS

Communication issued Oct. 22, 2024 by the Japanese Patent Office in Japanese Patent Application No. 2023-559756.
(Continued)

*Primary Examiner* — Henry Luong
(74) *Attorney, Agent, or Firm* — Sughrue Mion, PLLC

(57) ABSTRACT

An electronic apparatus includes: a housing including a coupling region; and a printed circuit board (PCB) including: an overlap region that overlaps the coupling region; a non-overlap region that does not overlap the coupling region; a plurality of metal layers including a plurality of lines; and a void portion in which a portion of at least one metal layer, among the plurality of metal layers, is not formed so that the at least one metal layer is discontinuous or terminated in the void portion, the at least one metal layer including a metal layer that is closest to the coupling region among the plurality of metal layers.

15 Claims, 12 Drawing Sheets

(51) Int. Cl.
  *H04M 1/02* (2006.01)
  *H05K 1/02* (2006.01)
  *H05K 7/14* (2006.01)

(52) U.S. Cl.
  CPC ....... *H04M 1/0268* (2013.01); *H04M 1/0277* (2013.01); *H05K 1/0243* (2013.01); *H05K 7/1427* (2013.01); *H05K 2201/10098* (2013.01)

(56) References Cited

U.S. PATENT DOCUMENTS

| | | | |
|---|---|---|---|
| 9,521,739 | B2 | 12/2016 | Fu |
| 9,538,681 | B2 | 1/2017 | Kim et al. |
| 9,793,599 | B2 | 10/2017 | Di Nallo et al. |
| 10,034,365 | B2 | 7/2018 | Yang |
| 2009/0322625 | A1 | 12/2009 | Yamazaki |
| 2011/0268593 | A1 | 11/2011 | Yamada et al. |
| 2012/0176754 | A1 | 7/2012 | Merz et al. |
| 2013/0257659 | A1 | 10/2013 | Darnell et al. |
| 2014/0268623 | A1 | 9/2014 | Kim et al. |
| 2016/0050747 | A1 | 2/2016 | Fu |
| 2016/0261023 | A1 | 9/2016 | Di Nallo et al. |
| 2017/0171960 | A1 | 6/2017 | Yang |
| 2018/0192320 | A1 | 7/2018 | Khlat et al. |
| 2019/0254164 | A1 | 8/2019 | Iwai et al. |
| 2019/0357345 | A1 | 11/2019 | Yazaki et al. |
| 2020/0045815 | A1 | 2/2020 | Ito |
| 2020/0367356 | A1 | 11/2020 | Koshio |

FOREIGN PATENT DOCUMENTS

| | | | | |
|---|---|---|---|---|
| JP | 2016-32080 | A | 3/2016 | |
| JP | 2016-509424 | A | 3/2016 | |
| KR | 10-2005-0035313 | A | 4/2005 | |
| KR | 10-2020-0014231 | A | 2/2020 | |
| KR | 10-2020-0018282 | A | 2/2020 | |
| RU | 2 654 345 | C2 | 5/2018 | |
| WO | WO-2019159549 | A1 * | 8/2019 | ........... G06F 1/1626 |

OTHER PUBLICATIONS

Communication dated Mar. 23, 2024, issued by the Federal Service for Intellectual Property in Russian Application No. 2023125959/07(057334).

Communication issued Aug. 9, 2024 by the European Patent Office in European Patent Application No. 22788278.4.

Communication issued on Sep. 10, 2024 by the Indian Patent Office in Indian Patent Application No. 202347068500.

Communication dated Jul. 20, 2025, issued by the Korean Intellectual Property Office in Korean Application No. 10-2021-0046941.

* cited by examiner

ELECTRONIC APPARATUS FOR STABLE ELECTRICAL CONNECTION

CROSS-REFERENCE TO RELATED APPLICATIONS

This application is a continuation application of International Application No. PCT/KR2022/003839, filed on Mar. 18, 2022, which is based on and claims priority to Korean Patent Application No. 10-2021-0046941, filed on Apr. 12, 2021, in the Korean Intellectual Property Office, the disclosure of which is incorporated by reference herein in its entirety.

BACKGROUND

1. Field

The disclosure relates to an electronic device for a stable electrical connection.

2. Description of Related Art

Antennas used in electronic devices include monopole type antennas, and among the monopole type antennas, inverted F antennas or planar inverted F antennas are widely used. An antenna includes a feed portion and a ground portion, and the analysis and characteristics of a monopole antenna are on the premise that its ground portion is infinitely large and is manufactured as a perfect conductor. However, the ground portion is neither infinitely large nor a perfect conductor in practice. In consideration of components and structures in an electronic device, the ground portion may be formed in various geometrical shapes, and in some cases, a plurality of ground portions may function as one ground portion. In a case of a ground portion that is not sufficiently large, the ground portion may not perform its original function but perform as a radiator. Typically, in a case of a ground portion having a circular shape, the diameter of the ground portion may need to correspond to at least one wavelength of a signal. When the size of the ground portion is sufficiently large but is not manufactured as a conductor with desirable characteristics, all characteristics of the antenna may be affected thereby.

To connect a signal to an antenna in an electronic device, the electronic device may require a printed circuit board (PCB), and a ground portion of the PCB may function as a ground portion of the antenna, which may greatly affect the performance of the antenna. In addition, only the ground portion of the PCB having a small size may not implement a desired performance of the antenna, and thus a connection between the PCB and other electrical/mechanical component(s) in the electronic device may be considered important. Therefore, the ground portion of the PCB may need to be stably connected to other conductors to function as a wide ground portion, and structures including the ground portion of the PCB and its connection structure may need to be designed without deviation.

SUMMARY

Provided is an electronic device that implements a stable electrical connection between a printed circuit board (PCB) and peripheral conductive component(s).

According to an aspect of the disclosure, an electronic device includes: a housing including a coupling region; and a printed circuit board (PCB) including: an overlap region that overlaps the coupling region; a non-overlap region that does not overlap the coupling region; a plurality of metal layers including a plurality of lines; and a void portion in which a portion of at least one metal layer, among the plurality of metal layers, is not formed so that the at least one metal layer is discontinuous or terminated in the void portion, the at least one metal layer including a metal layer that is closest to the coupling region among the plurality of metal layers.

The at least one metal layer may not include a metal layer that is farthest from the coupling region among the plurality of metal layers.

The void portion may be in the non-overlap region, and the at least one metal layer may include only the metal layer that is closest to the coupling region.

The plurality of lines may be provided in both the overlap region and the non-overlap region.

The electronic device may further include an antenna including a ground portion, and the ground portion may be electrically connected to the metal layer that is closest to the coupling region among the plurality of metal layers.

The electronic device may further include an antenna, the housing may include an accommodating portion configured to accommodate the antenna, and the coupling region is at a boundary of the accommodating portion.

The plurality of lines may be lines through which signals pass.

The electronic device may further include: an antenna including a ground portion that is connected to the plurality of lines or forms at least a portion of the plurality of lines.

The housing may have a bottom surface including the coupling region and a non-coupling region that is different from the coupling region, and the housing may further include a protruding rib that protrudes from the coupling region of the bottom surface and contacts the PCB.

The housing may further include: a hole formed on the protruding rib; and a fixing member coupled to the hole and configured to fix the PCB to the protruding rib.

The protruding rib may include a burr contacting the metal layer that is closest to the coupling region.

The PCB may further include at least one dielectric layer on or under at least one metal layer among the plurality of metal layers.

The void portion may be in the non-overlap region.

The void portion may be in at least a portion of the overlap region and at least a portion of the non-overlap region.

The housing may further include a first housing including the coupling region and a second housing, and the electronic device may include: a hinge structure connecting the first housing and the second housing; and a display including a first area disposed in the first housing, a second area disposed in the second housing, and a flexible area between the first area and the second area.

According to one or more example embodiments, a stable electrical connection between a printed circuit board (PCB) and peripheral conductive component(s) may be implemented, and deviation of antenna performance in an electronic device may be reduced.

The effects of an electronic device according to various example embodiments are not limited to the effects described above, but other effects that are not described herein may be clearly understood from the following description by one of ordinary skill in the art.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Figure 1:
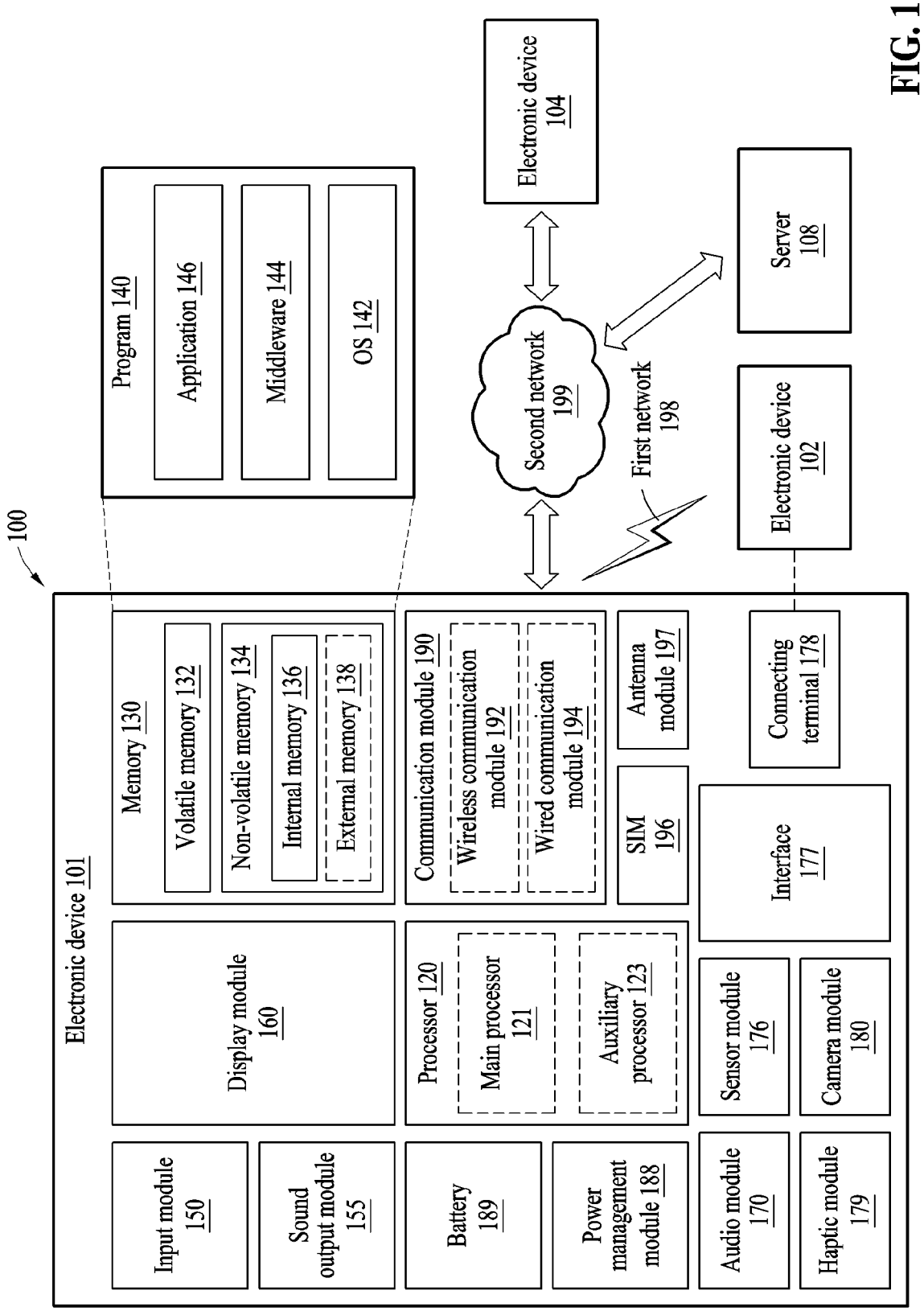
FIG. 1 is a block diagram illustrating an electronic device in a network environment according to one or more example embodiments.

It is to be understood that various example embodiments of the disclosure and the terms used herein are not intended to limit the technological features set forth herein to particular example embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B," "at least one of A and B," "at least one of A or B," "A, B, or C," "at least one of A, B, and C," and "at least one of A, B, or C," each of which may include any one of the items listed together in the corresponding one of the phrases, or all possible combinations thereof. Terms such as "1st" and "2nd" or "first" and "second" may simply be used to distinguish the component from other components in question, and do not limit the components in other aspects (e.g., importance or order). It is to be understood that if an element (e.g., a first element) is referred to, with or without the term "operatively" or "communicatively," as "coupled with," "coupled to," "connected with," or "connected to" another element (e.g., a second element), it denotes that the element may be coupled with the other element directly (e.g., by wire), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to one or more embodiments, the module may be implemented in the form of an application-specific integrated circuit (ASIC).

Various example embodiments as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to one or more embodiments, a method described herein may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as a memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). The electronic device 101 may communicate with the electronic device 104 via the server 108. The electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added to the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to one or more example embodiments, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. The processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently from or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an ISP or a CP) may be implemented as a portion of another component (e.g., the camera module 180 or the communication module 190) that is functionally related to the auxiliary processor 123. The auxiliary processor 123 (e.g., an NPU) may include a hardware structure specifically for artificial intelligence (AI) model processing. An AI model may be generated by machine learning. The learning may be performed by, for example, the electronic device 101, in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. The receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control its corresponding one of the displays, the hologram device, and the projector. The display module 160 may include a touch sensor adapted to sense a touch, or a pressure sensor adapted to measure an intensity of a force of the touch.

The audio module 170 may convert sound into an electric signal or vice versa. The audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with an external electronic device (e.g., the electronic device 102) directly (e.g., by wire) or wirelessly. The interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). The connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. The haptic module 179 may include, for example, a motor, a piezoelectric element, or an electric stimulator.

The camera module 180 may capture a still image and moving images. The camera module 180 may include one or more lenses, image sensors, ISPs, and flashes.

The power management module 188 may manage power supplied to the electronic device 101. The power management module 188 may be implemented as, for example, at least a part of a power management integrated circuit (PMIC).

The battery 189 may supply power to at least one component of the electronic device 101. The battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5$^{th}$ generation (5G) network, a next-generation communication network, the Internet, or a computer network (e.g., an LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4$^{th}$ generation (4G) network, and a next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., an mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to one or more example embodiments, another component (e.g., a radio frequency integrated circuit (RFIC)) other than the radiating element may be additionally formed as a part of the antenna module 197.

According to one or more example embodiments, the antenna module 197 may form an mmWave antenna module. The mmWave antenna module may include a PCB, an RFIC on a first surface (e.g., a bottom surface) of the PCB or adjacent to the first surface of the PCB and capable of supporting a designated high-frequency band (e.g., a mmWave band), and a plurality of antennas (e.g., an antenna array) disposed on a second surface (e.g., a top or a side surface) of the PCB, or adjacent to the second surface of the PCB and capable of transmitting or receiving signals in the designated high-frequency band.

At least some of the above-described components may be coupled mutually and exchange signals (e.g., commands or data) therebetween via an inter-peripheral communication scheme (e.g., a bus, general-purpose input and output (GPIO), serial peripheral interface (SPI), or mobile industry processor interface (MIPI)).

According to one or more example embodiments, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. All or some of operations to be executed by the electronic device 101 may be executed by one or more of the external electronic devices (e.g., the electronic devices 102 and 104 and the server 108). For example, if the electronic device 101 needs to perform a function or a service automatically, or in response to a request from a user or another device, the electronic device 101, instead of, or in addition to, executing the function or service, may request one or more external electronic devices to perform at least a part of the function or service. The one or more external electronic devices receiving the request may perform the at least part of the function or the service requested, or an additional function or an additional service related to the request and may transfer a result of the performance to the electronic device 101. The electronic device 101 may provide the result, with or without further processing of the result, as at least part of a response to the request. To that end, cloud computing, distributed computing, mobile edge computing (MEC), or client-server computing technology may be used, for example. The electronic device 101 may provide ultra-low latency services using, e.g., distributed computing or MEC. According to another embodiment, the external electronic device (e.g., the electronic device 104) may include an Internet-of-things (IoT) device. The server 108 may be an intelligent server using machine learning and/or a neural network. The external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

According to various example embodiments described herein, an electronic device may be a device of any one of various types. The electronic device may include, as non-limiting examples, a portable communication device (e.g., a smartphone), a computing device, a portable multimedia device, a portable medical device, a camera, a wearable device, or a home appliance. However, the electronic device is not limited to the foregoing examples.

Figure 2A:
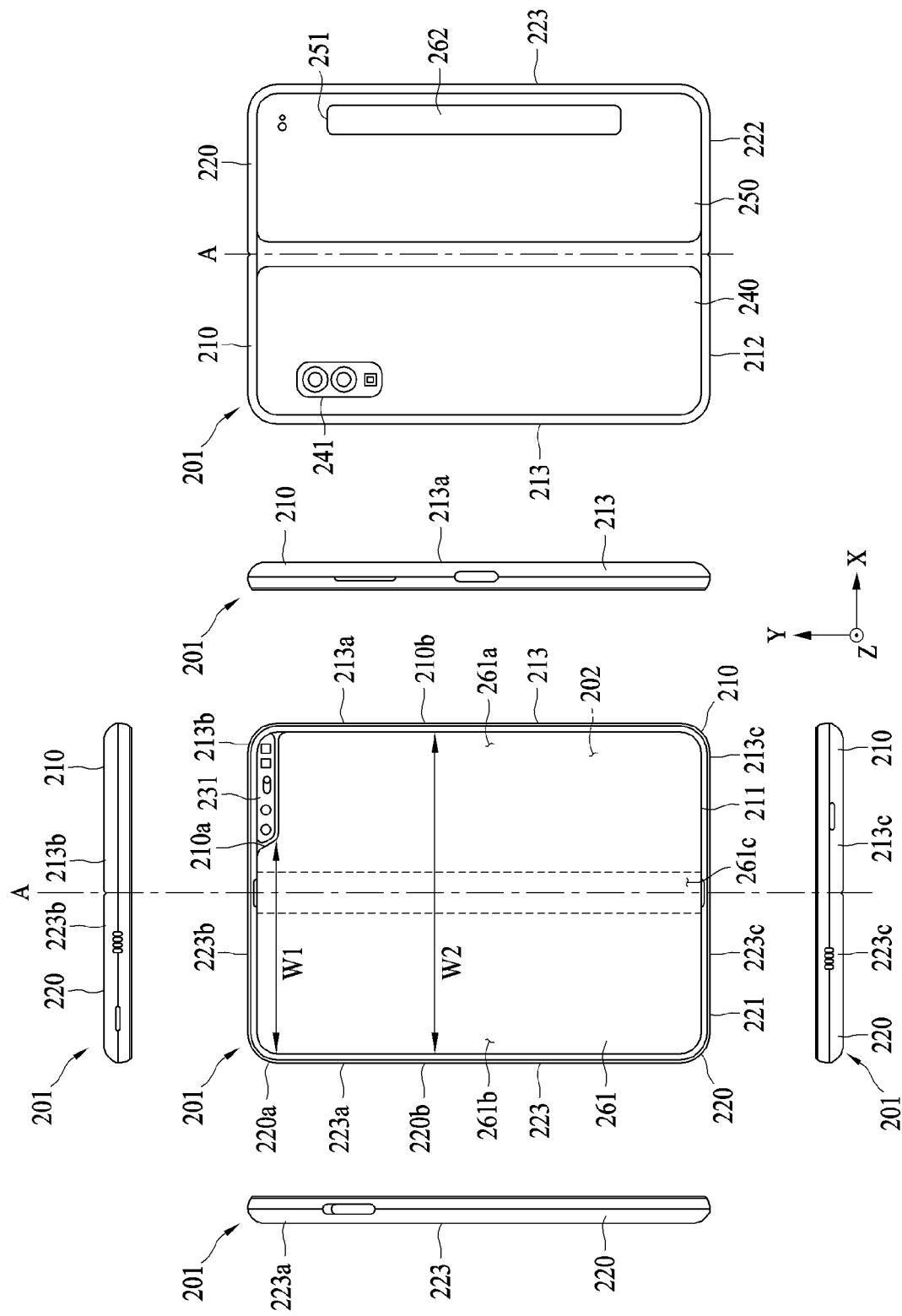
FIG. 2A is a view of an electronic device in an unfolded state according to one or more example embodiments.
Figure 2B:
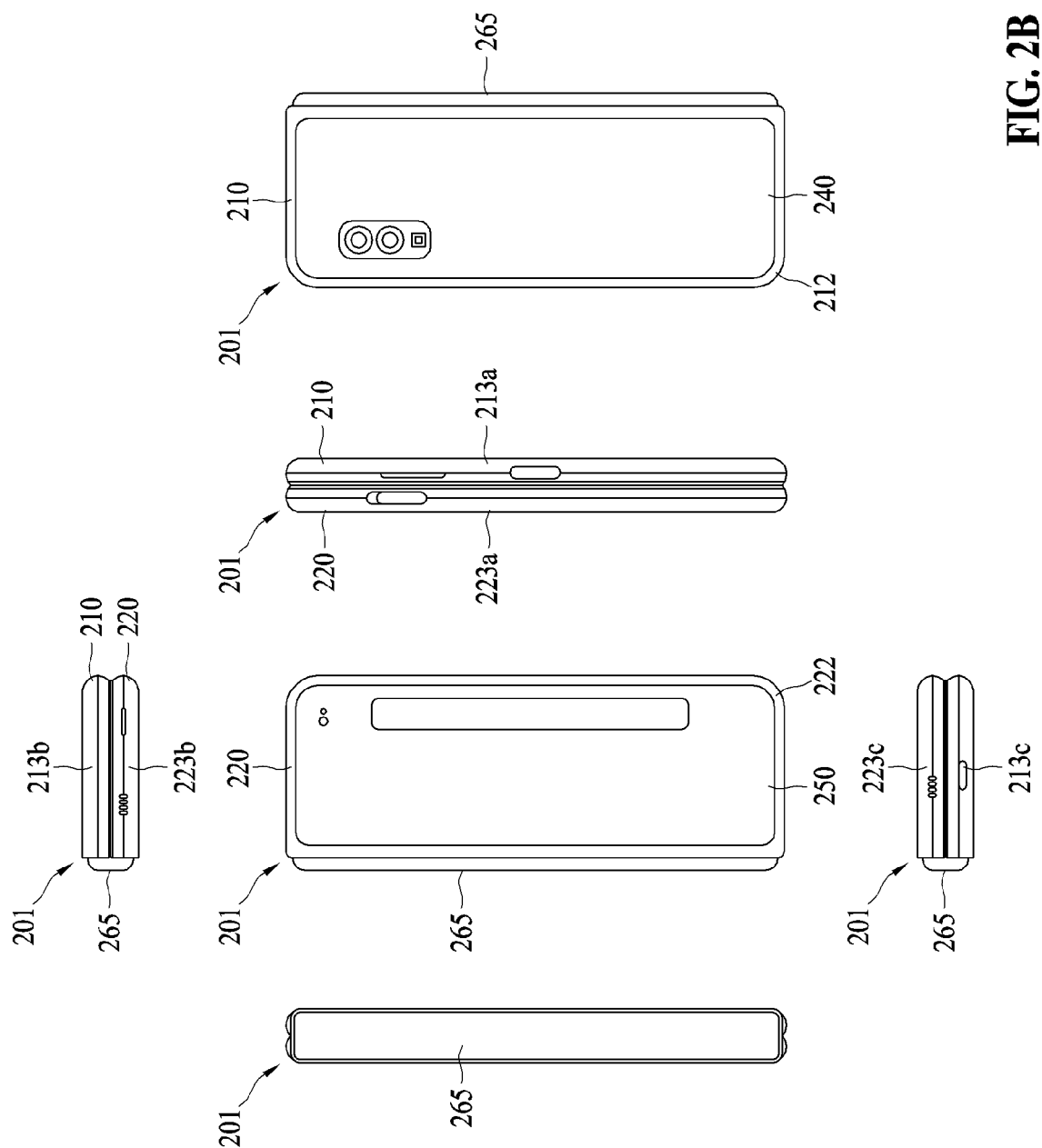
FIG. 2B is a view of an electronic device in a folded state according to one or more example embodiments.

Referring to FIGS. 2A and 2B, a foldable electronic device 201 may include a pair of housings 210 and 220 rotatably coupled to each other through a hinge structure to be folded with respect to each other, a hinge cover 265 for covering foldable portions of the pair of housings 210 and 220, and a display 261 (e.g., a flexible display or a foldable display) disposed in a space formed by the pair of housings 210 and 220. In one or more example embodiments, a surface on which the display 261 is disposed may be defined as a front surface of the foldable electronic device 201, and a surface opposite to the front surface may be defined as a rear surface of the foldable electronic device 201. In addition, a surface surrounding a space between the front surface and the rear surface may be defined as a side surface of the foldable electronic device 201.

In one or more example embodiments, the pair of housings 210 and 220 may include a first housing 210, a second housing 220, a first rear cover 240, and a second rear cover 250. The pair of housings 210 and 220 of the electronic device 201 are not limited to the shapes or the combination and/or coupling of components shown in FIGS. 2A and 2B but may be implemented in other shapes or by another combination and/or coupling of components.

In one or more example embodiments, the first housing 210 and the second housing 220 may be disposed on both sides with respect to a folding axis A and may be substantially symmetrical to the folding axis A. In one or more example embodiments, an angle or distance between the first housing 210 and the second housing 220 may vary depending on whether the electronic device 201 is in an unfolded state, a folded state, or an intermediate state. In one or more example embodiments, unlike the second housing 220, the first housing 210 may include a sensor area 231 in which various sensor modules (e.g., the sensor module 176 of FIG. 1) are disposed, and the first housing 210 and the second housing 220 may have shapes symmetrical to each other in areas other than the sensor area 231. In one or more other example embodiments, the sensor area 231 may be disposed at least a partial area of the second housing 220. In one or more other example embodiments, the sensor area 231 may be replaced with at least a partial area of the second housing 220. The sensor area 231 may include, for example, a camera hole area, a sensor hole area, an under-display camera (UDC) area, and/or an under-display sensor (UDS) area.

In one or more example embodiments, the first housing 210 may be connected to the hinge structure in the unfolded state of the electronic device 201. The first housing 210 may include a first surface 211 facing the front surface of the electronic device 201, a second surface 212 facing a direction opposite to the first surface 211, and a first side portion 213 enclosing at least a portion of a space between the first surface 211 and the second surface 212. The first side portion 213 may include a first side surface 213a disposed substantially in parallel to the folding axis A, a second side surface 213b extending in a direction substantially perpendicular to the folding axis A from one end of the first side surface 213a, and a third side surface 213c extending in a direction substantially perpendicular to the folding axis A from another end of the first side surface 213a and substantially parallel to the second side surface 213b. The second housing 220 may be connected to the hinge structure in the unfolded state of the electronic device 201. The second housing 220 may include a third surface 221 facing the front surface of the electronic device 201, a fourth surface 222 facing a direction opposite to the third surface 221, and a second side portion 223 enclosing at least a portion of a space between the third surface 221 and the fourth surface 222. The second side portion 223 may include a fourth side surface 223a disposed substantially in parallel to the folding axis A, a fifth side surface 223b extending in a direction substantially perpendicular to the folding axis A from one end of the fourth side surface 223a, and a sixth side surface 223c extending in a direction substantially perpendicular to the folding axis A from another end of the fourth side surface 223a and substantially parallel to the fifth side surface 223b. The first surface 211 and the third surface 221 may face each other when the electronic device 201 is in the folded state.

In one or more example embodiments, the electronic device 201 may include a recessed accommodating portion 202 for accommodating the display 261 through the structural coupling of the first housing 210 and the second housing 220. The accommodating portion 202 may have substantially the same size as the display 261. In one or more example embodiments, due to the sensor area 231, the accommodating portion 202 may have at least two different widths in a direction perpendicular to the folding axis A. For example, the accommodating portion 202 may have a first width W1 between a first portion 210a formed at an edge of the sensor area 231 of the first housing 210 and a second portion 220a parallel to the folding axis A of the second housing 220, and a second width W2 between a third portion 210b parallel to the folding axis A without overlapping the sensor area 231 of the first housing 210 and a fourth portion 220b of the second housing 220. The second width W2 may be greater than the first width W1. That is, the accommodating portion 202 may be formed to have the first width W1 from the first portion 210a of the first housing 210 to the second portion 220a of the second housing 220 and the second width W2 from the third portion 210b of the first housing 210 to the fourth portion 220b of the second housing 220, which have a mutually asymmetrical shape. The first portion 210a and the third portion 210b of the first housing 210 may be formed at different distances from the folding axis A. However, the width of the accommodating portion 202 may not be limited to the illustrated example. For example, the accommodating portion 202 may have three or more different widths by the shape of the sensor area 231 or the asymmetrical shape of the first housing 210 and the second housing 220.

In one or more example embodiments, at least a portion of the first housing 210 and the second housing 220 may be formed of a metal material or a non-metal material having a predetermined magnitude of rigidity appropriate to support the display 261.

In one or more example embodiments, the sensor area 231 may be formed adjacent to one corner of the first housing 210. However, the arrangement, shape, and size of the sensor area 231 are not limited to the illustrated example. In one or more other example embodiments, the sensor area 231 may be formed at another corner of the first housing 210 or in a predetermined area of an upper corner and a lower corner. In one or more other example embodiments, the sensor area 231 may be disposed in at least a partial area of the second housing 220. In one or more example embodiments, the sensor area 231 may be formed in a shape extending between the first housing 210 and the second housing 220.

In one or more example embodiments, the electronic device 201 may include at least one component disposed to be exposed on the front surface of the electronic device 201 through the sensor area 231 or at least one opening formed in the sensor area 231. The component may include, for example, at least one of a front camera module, a receiver, a proximity sensor, an illuminance sensor, an iris recognition sensor, an ultrasonic sensor, or an indicator.

In one or more example embodiments, the first rear cover 240 may be disposed on the second surface 212 of the first housing 210 and may have substantially rectangular edges. At least a portion of the edges of the first rear cover 240 may be surrounded by the first housing 210. The second rear cover 250 may be disposed on the fourth surface 222 of the second housing 220 and may have substantially rectangular edges. At least a portion of the edges of the second rear cover 250 may be surrounded by the second housing 220.

In one or more example embodiments, the first rear cover 240 and the second rear cover 250 may have substantially symmetrical shapes with respect to the folding axis A. In one or more other example embodiments, the first rear cover 240 and the second rear cover 250 may have different shapes. In still one or more other example embodiments, the first housing 210 and the first rear cover 240 may be integrally formed, and the second housing 220 and the second rear cover 250 may be integrally formed.

In one or more example embodiments, the first housing 210, the second housing 220, the first rear cover 240, and the second rear cover 250 may provide a space in which various components (e.g., a PCB, the antenna module 197 of FIG. 1, the sensor module 176 of FIG. 1, or the battery 189 of FIG. 1) of the electronic device 201 may be arranged through a structure in which the first housing 210, the second housing 220, the first rear cover 240, and the second rear cover 250 are coupled to one another. In one or more example embodiments, at least one component may be visually exposed on the rear surface of the electronic device 201. For example, at least one component may be visually exposed through a first rear area 241 of the first rear cover 240. The component may include, for example, a proximity sensor, a rear camera module, and/or a flash. In one or more example embodiments, at least a portion of a sub-display 262 may be visually exposed through a second rear area 251 of the second rear cover 250. In one or more example embodiments, the electronic device 201 may include a sound output module (e.g., the sound output module 155 of FIG. 1) disposed through at least a partial area of the second rear cover 250.

In one or more example embodiments, the display 261 may be disposed in the accommodating portion 202 formed by the pair of housings 210 and 220. For example, the display 261 may be formed to occupy substantially most of the front surface of the electronic device 201. The front surface of the electronic device 201 may include an area in which the display 261 is disposed, and a partial area (e.g., an edge area) of the first housing 210 and a partial area (e.g., an edge area) of the second housing 220, which are adjacent to the display 261. The rear surface of the electronic device 201 may include the first rear cover 240, a partial area (e.g., an edge area) of the first housing 210 adjacent to the first rear cover 240, the second rear cover 250, and a partial area (e.g., an edge area) of the second housing 220 adjacent to the second rear cover 250. In one or more example embodiments, the display 261 may be a display in which at least one area is deformable into a planar surface or a curved surface. In one or more example embodiments, the display 261 may include a folding area 261c, a first area 261a on a first side (e.g., the right side) of the folding area 261c, and a second area 261b on a second side (e.g., the left side) of the folding area 261c. For example, the first area 261a may be disposed on the first surface 211 of the first housing 210, and the second area 261b may be disposed on the third surface 221 of the second housing 220. However, the area division of the display 261 is provided merely as an example, and the display 261 may be divided into a plurality of areas depending on the structure or functions of the display 261. For example, as shown in FIG. 2A, the display 261 may be divided into areas based on the folding axis A or the folding area 261c extending in parallel to a Y-axis, or the display 261 may be divided into areas based on another folding area (e.g., a folding area extending in parallel to an X-axis) or another folding axis (e.g., a folding axis parallel to the X-axis). This area division of the display 261 is provided merely as an example of physical division based on the pair of housings 210 and 220 and the hinge structure, and the display 261 may display substantially one screen through the pair of housings 210 and 220 and the hinge structure. In one or more example embodiments, the first area 261a may include a notch area formed along the sensor area 231, but the other areas of the first area 261a may be substantially symmetrical to the second area 261b. In one or more other example embodiments, the first area 261a and the second area 261b may have substantially symmetrical shapes with respect to the folding area 261c.

In one or more example embodiments, the hinge cover 265 may be disposed between the first housing 210 and the second housing 220 and configured to cover the hinge structure. The hinge cover 265 may be hidden by at least a portion of the first housing 210 and the second housing 220 or exposed to the outside according to an operating state of the electronic device 201. For example, when the electronic device 201 is in an unfolded state as shown in FIG. 2A, the hinge cover 265 may be hidden by the first housing 210 and the second housing 220 so that it is not exposed to the outside, and when the electronic device 201 is in a folded state as shown in FIG. 2B, the hinge cover 265 may be exposed to the outside between the first housing 210 and the second housing 22. In addition, when the electronic device 201 is in an intermediate state in which the first housing 210 and the second housing 220 form an angle with each other, at least a portion of the hinge cover 265 may be exposed to the outside between the first housing 210 and the second housing 220. In this case, an area of the hinge cover 265 exposed to the outside may be smaller than an area of the hinge cover 265 exposed when the electronic device 201 is in the folded state. In one or more example embodiments, the hinge cover 265 may have a curved surface.

The operations of the electronic device 201 will be described hereinafter. When the electronic device 201 is in the unfolded state (e.g., a state of the electronic device 201 of FIG. 2A), the first housing 210 and the second housing 220 may form a first angle (e.g., approximately 180 degrees (°)) with each other, and the first area 261a and the second area 261b of the display 261 may be oriented in substantially the same direction. The folding area 261c of the display 261 may be on substantially the same plane as the first area 261a and the second area 261b. In one or more other example embodiments, when the electronic device 201 is in the unfolded state, the first housing 210 may rotate at a second angle (e.g., approximately 360°) relative to the second housing 220, whereby the first housing 210 and the second housing 220 may be reversely folded such that the second surface 212 and the fourth surface 222 may face each other.

In addition, when the electronic device 201 is in the folded state (e.g., a state of the electronic device 201 of FIG. 2B), the first housing 210 and the second housing 220 may face each other. The first housing 210 and the second housing 220 may form an angle of approximately 0° to approximately 10°, and the first area 261a and the second area 261b of the display 261 may face each other. At least a portion of the folding area 261c of the display 261 may be deformed into a curved surface.

In addition, when the electronic device 201 is in the intermediate state, the first housing 210 and the second housing 220 may form a predetermined angle with each other. An angle (e.g., a third angle, approximately 90°) formed by the first area 261a and the second area 261b of the display 261 may be greater than an angle formed when the electronic device 201 is in the folded state and less than an angle formed when the electronic device 201 is in the unfolded state. At least a portion of the folding area 261c of the display 261 may be deformed into a curved surface. In this case, a curvature of the curved surface of the folding area 261c may be smaller than that formed when the electronic device 201 is in the folded state.

Various example embodiments of the electronic device described herein are not limited to a form factor of the electronic device 201 described with reference to FIGS. 2A and 2B, and may also apply to electronic devices with various form factors.

Figure 3:
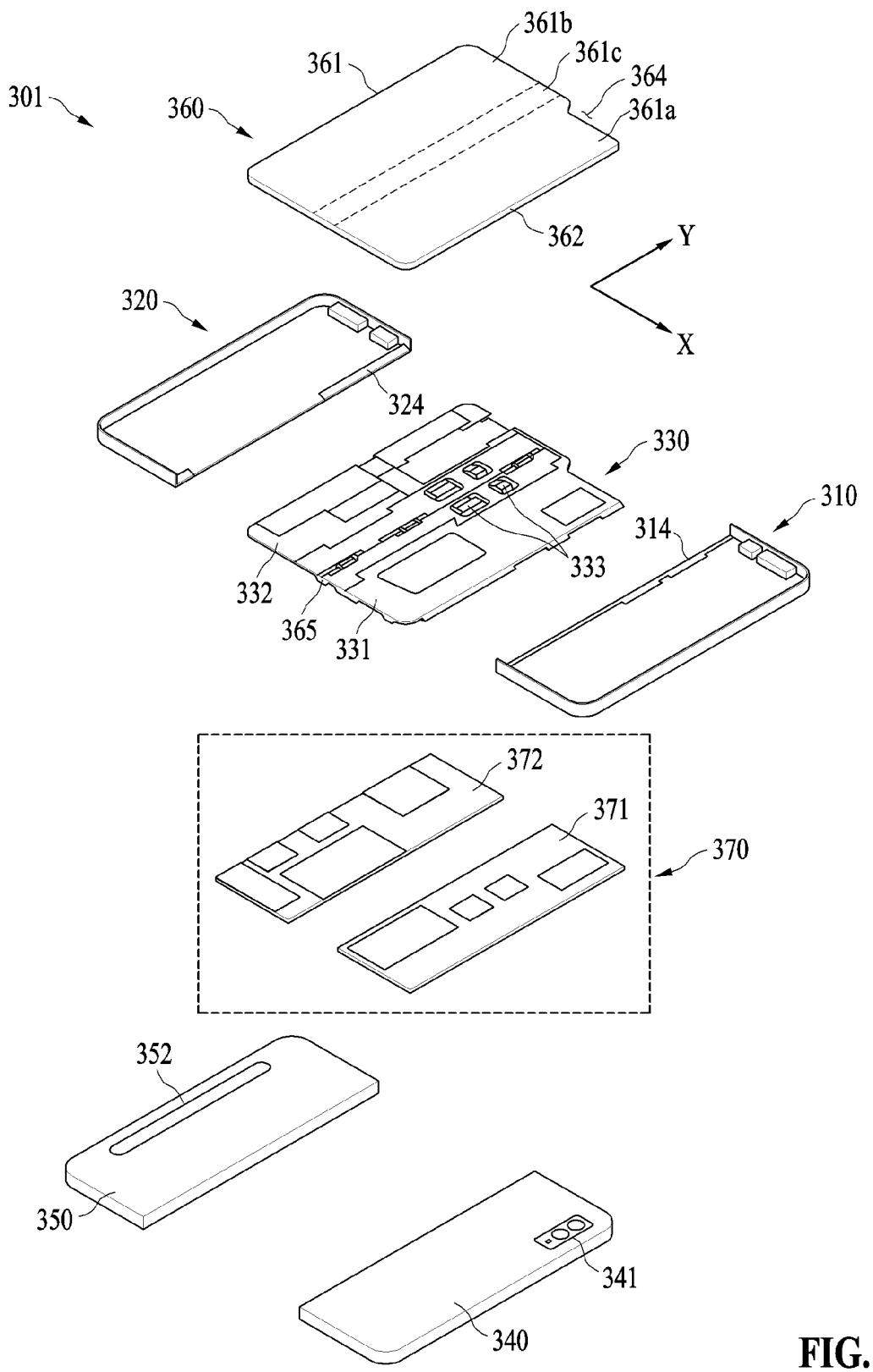
FIG. 3 is an exploded perspective view of an electronic device according to one or more example embodiments.

Referring to FIG. 3, according to various example embodiments, an electronic device 301 may include a display module 360 (e.g., the display module 160), a hinge assembly 330, a substrate 370, a first housing 310 (e.g., the first housing 210), a second housing 320 (e.g., the second housing 220), a first rear cover 340 (e.g., the first rear cover 240) including a first rear area 341 (e.g., the first rear area 241), and a second rear cover 350 (e.g., the second rear cover 250) including a second rear area 351 (e.g., the second rear area 251).

The display module 360 may include a display 361 (e.g., the display 261) and at least one layer or plate 362 on which the display 361 is disposed. In one or more example embodiments, the plate 362 may be disposed between display 361 and a hinge assembly 330. The display 361 may be disposed on at least a portion of one surface (e.g., an upper surface) of the plate 362. The plate 362 may be formed in a shape corresponding to that of the display 361. For example, a partial area of the plate 362 may be formed in a shape corresponding to a notch area 364 of the display 361.

The hinge assembly 330 may include a first bracket 331, a second bracket 332, a hinge structure disposed between the first bracket 331 and the second bracket 332, a hinge cover 365 configured to cover the hinge structure when viewed from the outside, and a wiring member 333 (e.g., a flexible printed circuit (FPC)) crossing the first bracket 331 and the second bracket 332.

In one or more example embodiments, the hinge assembly 330 may be disposed between the plate 362 and the substrate 370. For example, the first bracket 331 may be disposed between the first area 361a of the display 361 and a first substrate 371. The second bracket 332 may be disposed between the second area 361b of the display 361 and a second substrate 372.

In one or more example embodiments, at least a portion of the wiring member 333 and the hinge structure may be disposed inside the hinge assembly 330. The wiring member 333 may be disposed in a direction (e.g., an X-axis direction) crossing the first bracket 331 and the second bracket 332. The wiring member 333 may be disposed in a direction (e.g., the x-axis direction) substantially perpendicular to a folding axis (e.g., the Y-axis or the folding axis A of FIG. 2A) of a flexible area 361c of the electronic device 301.

The substrate 370 may include the first substrate 371 disposed on the side of the first bracket 331 and the second substrate 372 disposed on the side of the second bracket 332. The first substrate 371 and the second substrate 372 may be arranged inside a space formed by the hinge assembly 330, the first housing 310, the second housing 320, the first rear cover 340, and the second rear cover 350. On the first substrate 371 and the second substrate 372, components for implementing various functions of the electronic device 301 may be mounted.

The first housing 310 and the second housing 320 may be assembled to each other so as to be coupled to both sides of the hinge assembly 330 while the display module 360 is coupled to the hinge assembly 330. The first housing 310 and the second housing 320 may be coupled to the hinge assembly 330 by sliding on both sides of the hinge assembly 330.

In one or more example embodiments, the first housing 310 may include a first rotation support surface 314, and the second housing 320 may include a second rotation support surface 324 corresponding to the first rotation support surface 314. The first rotation support surface 314 and the second rotation support surface 324 may each include a curved surface corresponding to a curved surface included in the hinge cover 365.

In one or more example embodiments, when the electronic device 301 is in an unfolded state (e.g., a state of the electronic device 201 of FIG. 2A), the first rotation support surface 314 and the second rotation support surface 324 may cover the hinge cover 365 such that the hinge cover 365 may not be exposed through the rear surface of the electronic device 301 or may be minimally exposed. In addition, when the electronic device 301 is in a folded state (e.g., a state of the electronic device 201 of FIG. 2B), the first rotation support surface 314 and the second rotation support surface 324 may rotate along the curved surface included in the hinge cover 365 such that the hinge cover 365 may be maximally exposed through the rear surface of the electronic device 301.

Figure 4A:
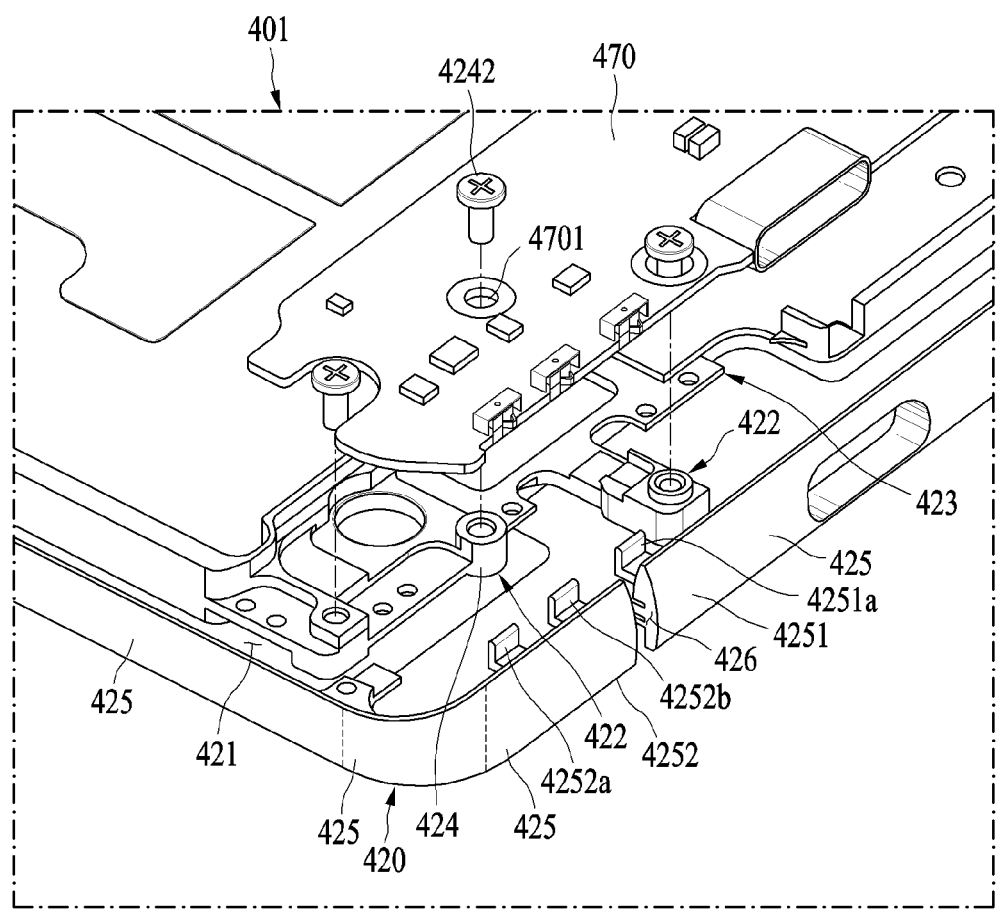
FIG. 4A is an exploded perspective view of a partial structure of an electronic device according to one or more embodiments.
Figure 4B:
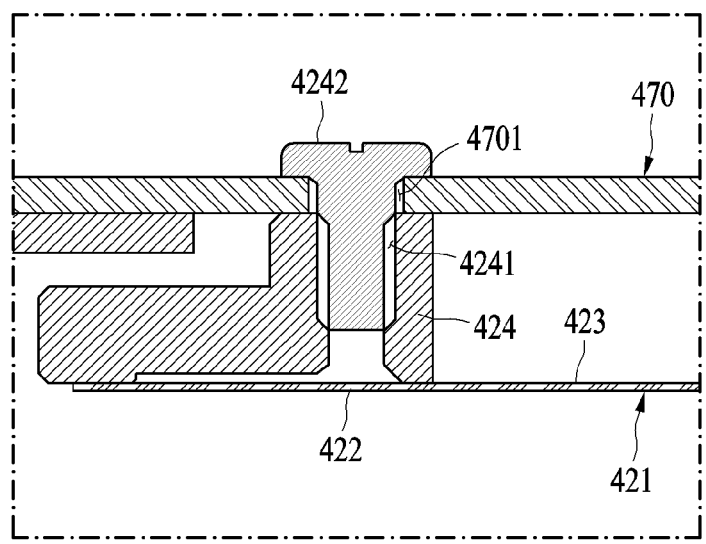
FIG. 4B is a view of a coupling structure between a housing and a printed circuit board (PCB) in the electronic device of FIG. 4A.

Referring to FIGS. 4A and 4B, according to one or more example embodiments, an electronic device 401 (e.g., the electronic device 301) may include at least one housing 420 (e.g., the first housing 310 and/or the second housing 320), and the at least one housing 420 may include a plurality of side members 425 that forms a side frame defining an internal space of the housing 420. In one or more example embodiments, a slit 426 may be formed between any pair of neighboring side members 425 among the plurality of side members 425. In one or more example embodiments, some side members 425 among the plurality of side members 425 may have a round shape.

In one or more example embodiments, at least one first feed terminal 4251a may be disposed on a first side member 4251 of the plurality of side members 425, and at least one second feed terminal 4252a and/or at least one ground terminal 4252b may be disposed on a second side member 4252 of the plurality of side members 425. In one or more example embodiments, the plurality of side members 425 may at least partially include a conductive material.

In one or more example embodiments, at least some of the plurality of side members 425 may serve as a radiating conductor of an antenna. For example, a processor (e.g., the processor 120) and/or a communication module (e.g., the communication module 190) of the electronic device 401 may perform wireless communication through one or more of the plurality of side members 425 that serves as the radiating conductor of the antenna.

In one or more example embodiments, one or more of the plurality of side members 425 may be electrically connected to a PCB 470. For example, the at least one first feed terminal 4251a disposed on the first side member 4251 and/or the at least one second feed terminal 4252a disposed on the second side member 4252 may be electrically connected to one portion of the PCB 470, the at least one ground terminal 4252b disposed on the second side member 4252 may be electrically connected to another portion of the PCB 470, and a conductive material portion forming the at least some of the side members 425 may form a portion of the antenna between a portion in which the at least one first feed terminal 4251a is disposed and/or the at least one second feed terminal 4252a is disposed and a portion in which the at least one ground terminal 4252b is disposed.

In one or more example embodiments, the housing 420 may include a bottom surface 421 disposed in the internal space formed by the plurality of side members 425, and the bottom surface 421 may include a coupling region 422 coupled to the PCB 470 and a non-coupling region 423 that is not coupled to the PCB 470. In one or more example embodiments, the housing 420 may include a protruding rib 424 protruding from the coupling region 422. One surface (e.g., an upper surface) of the protruding rib 424 may contact a partial area (e.g., an overlap region A1) of the PCB 470 and support the PCB 470. In one or more example embodiments, the protruding rib 424 may be fastened to the PCB 470. For example, the PCB 470 and the protruding rib 424 may include holes 4701 and 4241, respectively, and a fixing member 4242 may fix the PCB 470 to the protruding rib 424 through the hole 4701 of the PCB 470 and the hole 4241 of the protruding rib 424. In one or more example embodiments, the fixing member 4242 may include a structure, such as, for example, a screw, a hook, and/or other fixing structures. The shape and structure of the coupling region 422 that is to be coupled to the PCB 470 are not limited to the shape and structure of the protruding rib 424 described above, and there may be components of various shapes and structures.

Figure 5A:
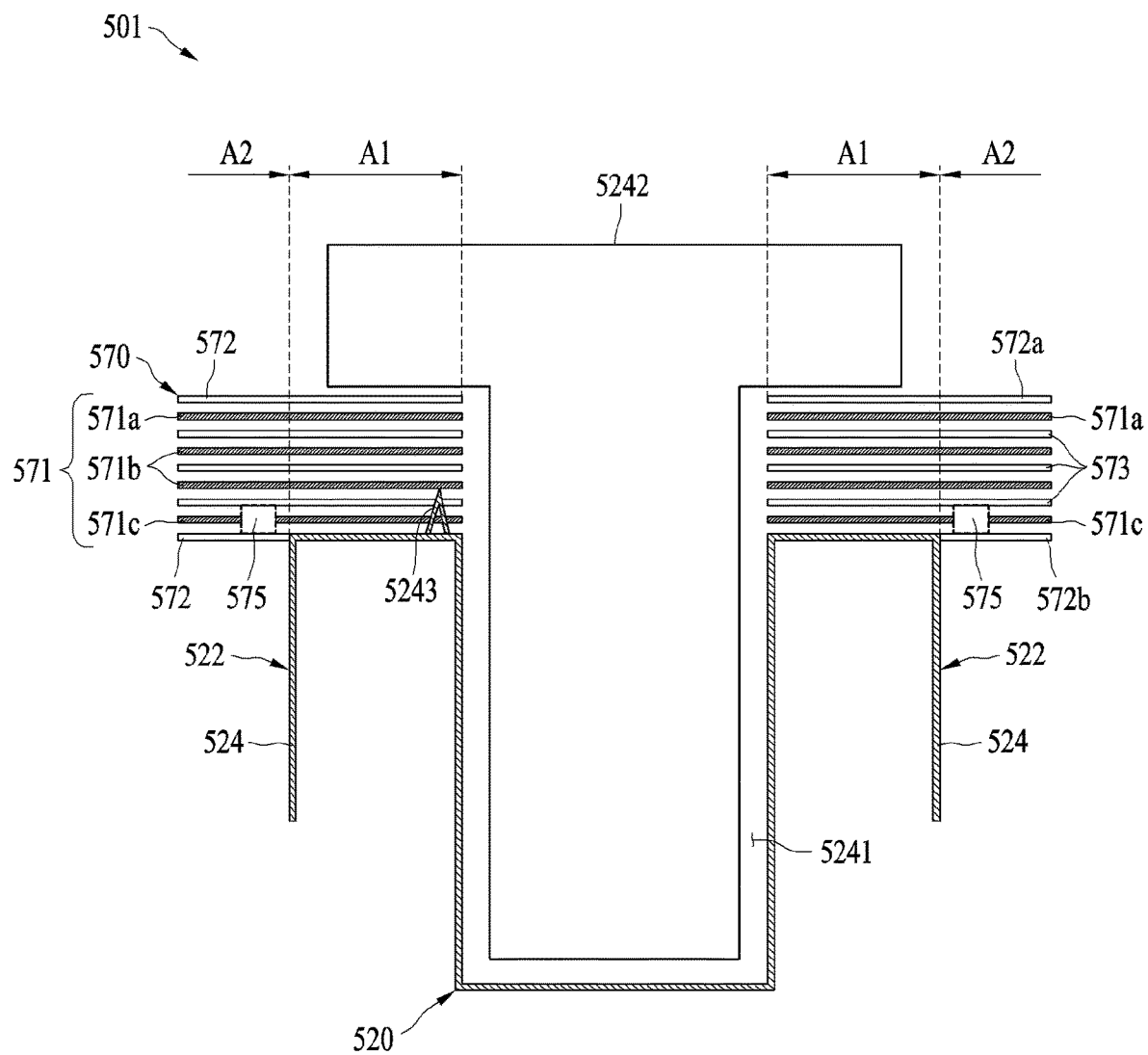
FIG. 5A is a view of a partial structure of an electronic device including a PCB according to one or more example embodiments.
Figure 5B:
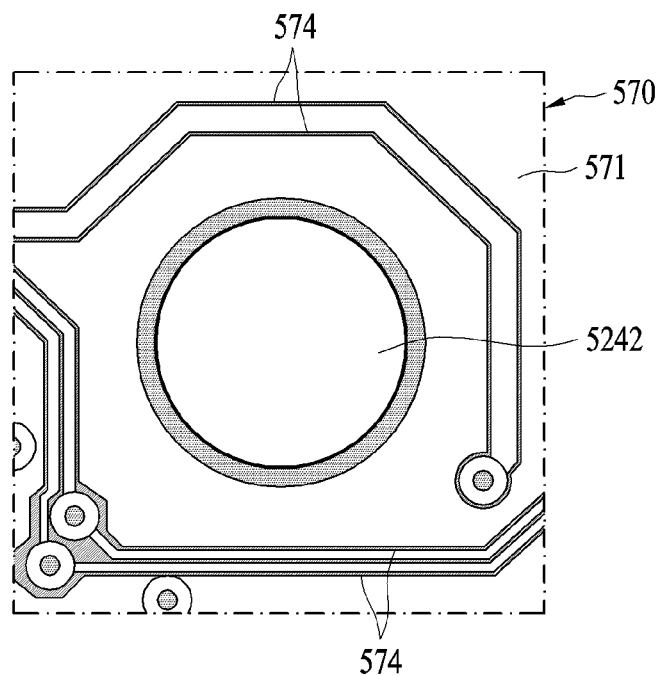
FIG. 5B is a view of a portion of a PCB including a plurality of lines according to one or more example embodiments.

Referring to FIGS. 5A and 5B, according to one or more example embodiments, an electronic device 501 (e.g., the electronic device 401) may include a housing 520 (e.g., the housing 420) and a PCB 570 (e.g., the PCB 470) coupled to the housing 520.

In one or more example embodiments, the housing 520 may include a protruding rib 524 (e.g., the protruding rib 424) protruding from a coupling region 522 (e.g., the coupling region 422) that is coupled to the PCB 570, a hole 5241 (e.g., the hole 4241) formed in the protruding rib 524, and a fixing member 5242 (e.g., the fixing member 4242) that fixes the PCB 570 to the protruding rib 524 and is fastened to the hole 5241.

In one or more example embodiments, in a case in which at least a portion of the coupling region 522 is formed of a metal material, the coupling region 522 may include a burr 5243. For example, the burr 5243 may be formed on one surface (e.g., the upper surface) of the protruding rib 524 in contact with the PCB 570. The term "burr" used herein indicates an end curl of a metal cut part.

In one or more example embodiments, the PCB 570 may include a plurality of metal layers 571, a plurality of printed solder resists 572, and a plurality of dielectrics 573. The plurality of metal layers 571 may include, for example, a first metal layer 571a (e.g., an upper layer), at least one second metal layer 571b (e.g., a middle layer), and a third metal layer 571c (e.g., a lower layer). The plurality of metal layers 571, the plurality of printed solder resists 572, and the plurality of dielectrics 573 may be stacked in a thickness direction of the PCB 570. In one or more example embodiments, a first printed solder resist 572a of the plurality of printed solder resists 572 may be disposed on the first metal layer 571a of the plurality of metal layers 571, and a second printed solder resist 572b of the plurality of printed solder resists 572 may be disposed under the third metal layer 571c of the plurality of metal layers 571. Each of the plurality of dielectrics 573 may be disposed between the first metal layer 571a and the at least one second metal layer 571b and/or between the at least one second metal layer 571b and the third metal layer 571c. When there is a plurality of second metal layers 571b, at least some of the plurality of dielectrics 573 may be disposed between a pair of neighboring second metal layers 571b. Such an arrangement of the plurality of metal layers 571, the plurality of printed solder resists 572, and the plurality of dielectrics 573 is not limited to the illustrated example, and various arrangements may also be applicable.

In one or more example embodiments, one or more of the plurality of metal layers 571 may be electrically connected to a ground portion (e.g., the ground terminal 4252b) of an antenna of the electronic device 501. For example, the at least one second metal layer 571b and the third metal layer 571c may be connected to the ground portion of the antenna of the electronic device 501. For another example, only the third metal layer 571c may be connected to the ground portion of the antenna of the electronic device 501.

In one or more example embodiments, the PCB 570 may include an overlap region A1 that overlaps the coupling region 522 of the housing 520 and a non-overlap region A2 that does not overlap the coupling region 522. For example, the overlap region A1 may indicate a region that overlaps at least a portion of the protruding rib 524, while the non-overlap region A2 may indicate a region that does not overlap any portion of the protruding rib 524.

In one or more example embodiments, the plurality of metal layers 571 may include a plurality of lines 574. For example, the plurality of lines 574 may be signal lines through which electrical signals pass. For another example, the plurality of lines 574 may be a portion of the ground portion (e.g., the ground terminal 4252*b*) that forms a portion of the antenna of the electronic device 501. For still another example, the plurality of lines 574 may be electrically connected to the ground portion that forms a portion of the antenna of the electronic device 501.

In one or more example embodiments, the plurality of lines 574 may be formed throughout both the overlap region A1 and the non-overlap region A2 of the PCB 570. That is, the plurality of lines 574 may be formed by maximally utilizing substantially most of the limited areas of the PCB 570 and may thus maximize the wiring efficiency of the PCB 570.

In one or more example embodiments, the PCB 570 may include a void portion 575 that is formed because a portion of at least one metal layer (e.g., the at least one second metal layer 571*b* and/or the third metal layer 571*c*) close to the coupling region 522 (e.g., one surface of the protruding rib 524) among the plurality of metal layers 571 is not formed, in the non-overlap region A2. That is, in the void portion 575, the at least one metal layer (e.g., the at least one second metal layer 571 and/or the third metal layer 571*c*) close to the coupling region 522 (e.g., one surface of the protruding rib 524), among the plurality of metal layers 571, may be electrically opened or discontinuous. When the burr 5243 that may occur in the coupling region 522 is in contact with at least one metal layer in which the void portion 575 is formed, this may prevent a direct contact between or an electrical connection between the burr 5243 and a line formed on the at least one metal layer and may thereby ensure a stable electrical connection or a reliable electrical disconnection between the PCB 570 and the ground portion (e.g., the ground terminal 4252*b*) of the antenna of the electronic device 501.

In one or more example embodiments, the void portion 575 may be formed not in all the plurality of metal layers 571. For example, the void portion 575 may not be formed in the first metal layer 571*a* that is located farthest from the coupling region 522 (e.g., one surface of the protruding rib 524) among the plurality of metal layers 571, but be formed on at least some of other metal layers, for example, 571*b* and 571*c*. This may ensure the plurality of lines 574 to pass through in the overlap region A1 of the PCB 570 overlapping the coupling region 522 (e.g., one surface of the protruding rib 524) where the burrs 5243 may occur and may thereby improve the wiring efficiency of the lines 574.

In one or more example embodiments, the void portion 575 may be formed only on the third metal layer 571*c* that is located closest to the coupling region 522 (e.g., one surface of the protruding rib 524). This may ensure a stable electrical connection or a reliable electrical disconnection between the PCB 570 and the ground portion (e.g., the ground terminal 4252*b*) of the antenna of the electronic device 501, while improving the wiring efficiency of the plurality of lines 574 that passes above and/or below the plurality of metal layers 571.

Figure 6A:
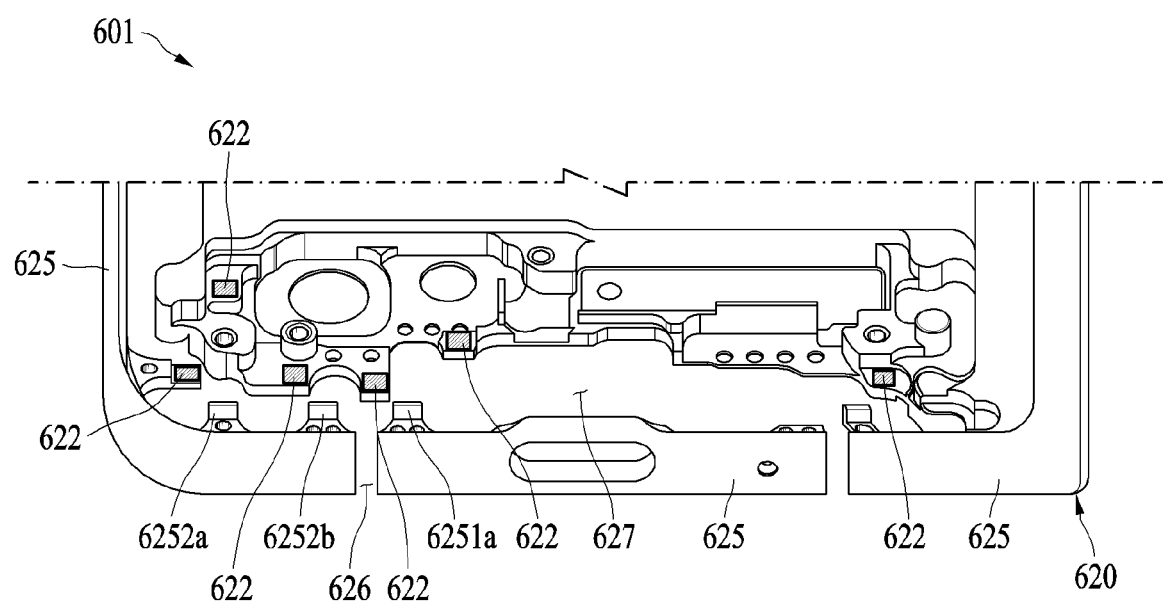
FIG. 6A is a view of regions coupled to a PCB among regions included in a housing of an electronic device according to one or more example embodiments.
Figure 6B:
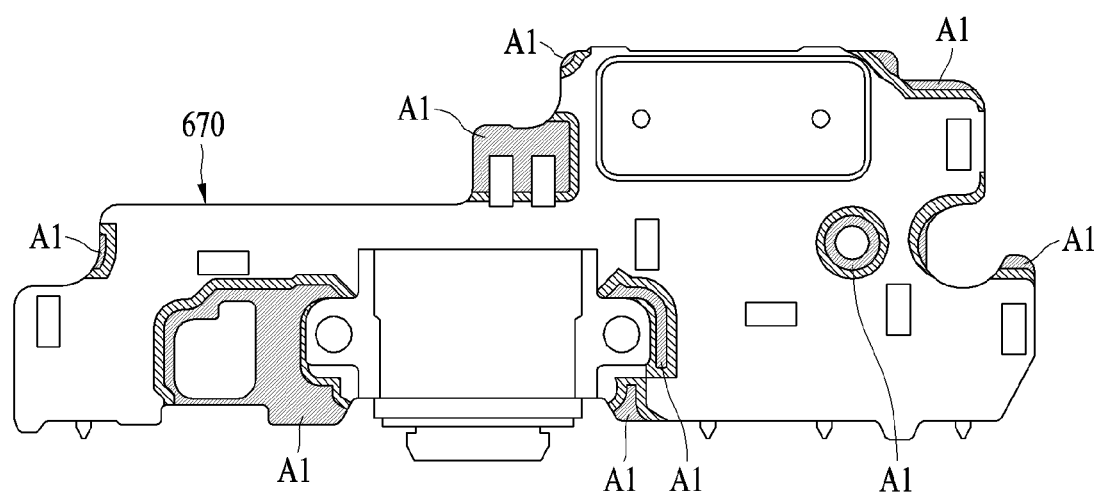
FIG. 6B is a view of regions coupled to coupling regions of the housing of FIG. 6A among regions included in a PCB of an electronic device according to one or more example embodiments.
Figure 6C:
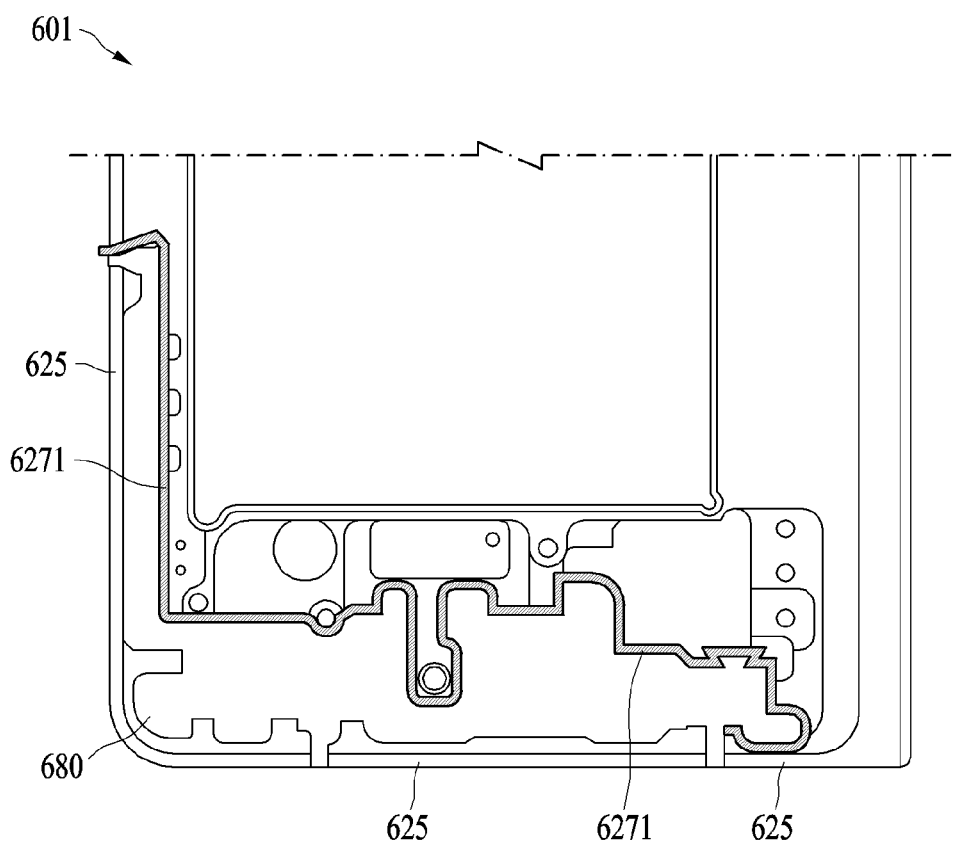
FIG. 6C is a view of regions to which the structure of the PCB of FIG. 5 is applicable among regions included in a housing of an electronic device according to one or more example embodiments.

Referring to FIGS. 6A to 6C, according to one or more example embodiments, an electronic device 601 (e.g., the electronic device 401) may include at least one housing 620 (e.g., the housing 420), and the at least one housing 620 may include a plurality of side members 625 (e.g., the side members 425) that forms a side frame defining an internal space of the housing 620.

The electronic device 601 may include an antenna 680 that serves as a radiating conductor. A processor (e.g., the processor 120) and/or a communication module (e.g., the communication module 190) of the electronic device 601 may perform wireless communication through the antenna 680. In one or more example embodiments, the antenna 680 may have a plate shape. In one or more example embodiments, the antenna 680 may be formed of a metal material. In one or more example embodiments, the antenna 680 may be electrically connected to one or more feed terminals 6251*a* and 6252*a* (e.g., the first feed terminal 4251*a* and/or the second feed terminal 4252*a*) formed on the plurality of side members 625, and at least one ground terminal 6252*b* (e.g., the ground terminal 4252*b*). In one or more example embodiments, at least a portion of the antenna 680 may be coupled to a slit 626 (e.g., the slit 426) between a pair of any neighboring side members 625.

In one or more example embodiments, the housing 620 may include an accommodating portion 627 that accommodates therein the antenna 680. The shape and size of the accommodating portion 627 may correspond to those of the antenna 680.

In one or more example embodiments, a coupling region 622 (e.g., the coupling region 422) of the housing 620 that overlaps an overlap region A1 of a PCB 670 (e.g., the PCB 470) may be located on a boundary 6271 of the accommodating portion 627 in which the antenna 680 is accommodated. This may be construed that a portion serving as the ground of the antenna 680 (e.g., a portion connected to the ground terminal 6252*b*) is required to be close to the antenna 680 and is required to be far away from a portion (e.g., the coupling region 622) where a burr (e.g., the burr 5243) may occur, which may ensure a stable electrical connection and/or a reliable electrical disconnection between the housing 620, the PCB 670, and the antenna 680.

In addition, in one or more example embodiments, in a case in which the electronic device 601 is a foldable electronic device (e.g., the electronic device 201), considering that a surface current density in areas of the antenna 680 located on the boundary 6271 of the accommodating portion 627 is large when the electronic device 601 is in a substantially unfolded state (e.g., as shown in FIG. 2A) and the electronic device 601 is in a substantially folded state (e.g., as shown in FIG. 2B), applying the structure of the PCB 570 described above with reference to FIG. 5A to the coupling region 622 located on the boundary 6271 of the accommodating portion 627 may ensure a stable electrical connection and/or a reliable electrical disconnection and reduce a performance deviation of the antenna 680 related thereto.

Figure 7:
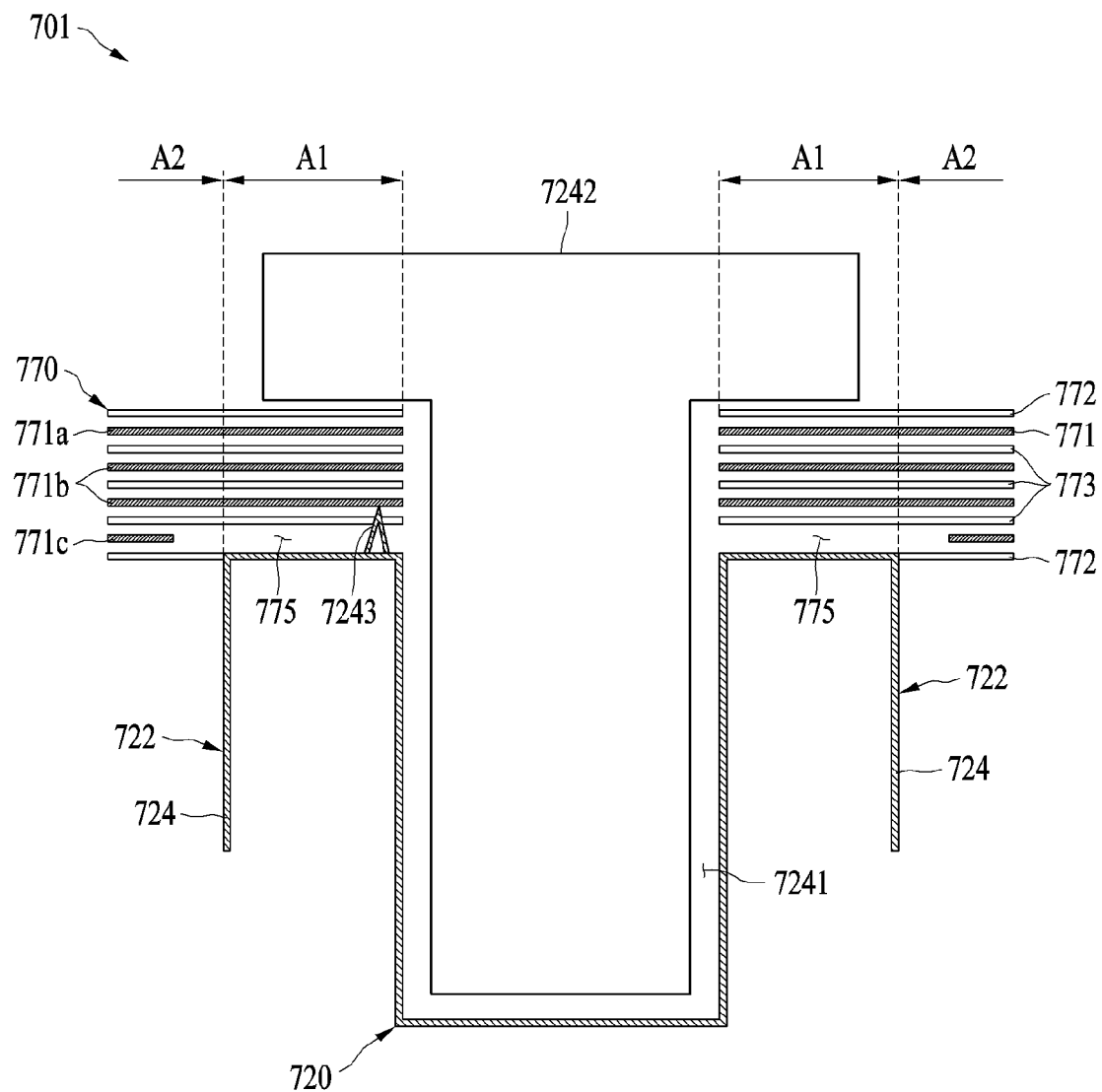
FIG. 7 is a view of a partial structure of an electronic device including a PCB according to one or more example embodiments.

Referring to FIG. 7, according to one or more example embodiments, an electronic device 701 (e.g., the electronic device 501) may include a housing 720 (e.g., the housing 520) and a PCB 770 (e.g., the PCB 570) coupled to the housing 720. The housing 720 may include a protruding rib 724 (e.g., the protruding rib 524), a hole 7241 (e.g., the hole 5241), and a fixing member 7242 (e.g., the fixing member 5242). A coupling region 722 (e.g., the coupling region 522) may include a burr 7243 (e.g., the burr 5243) formed on one surface (e.g., an upper surface) of the protruding rib 724. The PCB 770 may include a plurality of metal layers 771 (e.g., the plurality of metal layers 571), a plurality of printed solder resists 772 (e.g., the plurality of printed solder resists 572), and a plurality of dielectrics 773 (e.g., the plurality of dielectric 573). The PCB 770 may include an overlap region A1 that overlaps the coupling region 722 of the housing 720 and a non-overlap region A2 that does not overlap the coupling region 722.

The PCB 770 may include a void portion 775 (e.g., the void portion 575) in which a portion of at least one metal layer (e.g., at least one second metal layer 721b and/or a third metal layer 721c) close to the coupling region 722 among the plurality of metal layers 771 is not formed. In one or more example embodiments, the void portion 775 may be formed not in all the plurality of metal layers 771. For example, the void portion 775 may not be formed in a first metal layer 771a but may be formed in at least one of other metal layers, for example, 771b and 771c. In one or more example embodiments, the void portion 775 may be formed only on the third metal layer 771c closest to the coupling region 722 (e.g., one surface of the protruding rib 724).

In one or more example embodiments, the void portion 775 may be located throughout at least a portion of the overlap region A1 and at least a portion of the non-overlap region A2 of the PCB 770. In one or more example embodiments, the void portion 775 may be located over substantially all portions of the overlap region A1 and at least a portion of the non-overlap region A2 of the PCB 770. This structure, as in the structure of the PCB 570 described above with reference to FIGS. 5A and 5B, may prevent a direct contact between the burr 7243 and a line formed on at least one metal layer and may thereby ensure a stable electrical connection or a reliable electrical disconnection between the PCB 770 and a ground portion (e.g., the ground terminal 4252b) of an antenna of the electronic device 701.

According to one or more example embodiments, an electronic device 501 may include a housing 520 having a coupling region 522, and a PCB 570 having an overlap region A1 that overlaps the coupling region 522 and a non-overlap region A2 that does not overlap the coupling region 522. The PCB 570 may include a plurality of metal layers 571 and a plurality of lines 574, and may also include a void portion 575 in which a portion of at least one metal layer (e.g., 571b and 571c) close to the coupling region 522 among the plurality of metal layers 571 is not formed.

In one or more embodiments, the void portion 575 may not be located in the metal layer 571a that is farthest from the coupling region 522 among the plurality of metal layers 571.

In one or more embodiments, the void portion 575 may be located only in the metal layer 571c that is closest to the coupling region 522 among the plurality of metal layers 571, in the non-overlap region A2.

In one or more embodiments, the plurality of lines 574 may be formed in both the overlap region A1 and the non-overlap region A2.

In one or more embodiments, an antenna 680 including a ground portion may be further included, and the ground portion may be electrically connected to the metal layer 571c closest to the coupling region 522 among the plurality of metal layers 571.

In one or more example embodiments, an electronic device 601 may further include an antenna 680, a housing 620 may include an accommodating portion 627 configured to accommodate the antenna 680, and a coupling region 622 may be located on a boundary 6271 of the accommodating portion 627.

In one or more example embodiments, the plurality of lines 574 may be lines through which signals pass.

In one or more example embodiments, the electronic device 601 may further include the antenna 680 including a ground portion, and the ground portion may be connected to the plurality of lines 574 or may form at least a portion of the plurality of lines 574.

In one or more example embodiments, a housing 420 may have a bottom surface 421 having a coupling region 422 and a non-coupling region 423 different from the coupling region 422, and the housing 420 may include a protruding rib (e.g., 424 or 524) that protrudes from the coupling region (e.g., 422 or 522) of the bottom surface 421 and contacts the metal layer 571c closest to the coupling region (e.g., 422 or 522) among the plurality of metal layers 571.

In one or more example embodiments, the housing 420 may include a hole 4241 formed in the protruding rib 424 and a fixing member 4242 coupled to the hole 4241 and configured to fix the PCB 470 to the protruding rib 424.

In one or more example embodiments, the housing 520 may include a burr 5243 that is formed on the protruding rib 524 and meets the metal layer 571c closest to the coupling region 522 among the plurality of metal layers 571.

In one or more example embodiments, the PCB 570 may further include at least one dielectric layer 573 located on or under at least one metal layer 571 among the plurality of metal layers 571.

According to one or more example embodiments, an electronic device (e.g., 201 or 501) may include a first housing 210 having a coupling region 522, a second housing 220, and a hinge structure connecting the first housing 210 and the second housing 220, a display 261 including a first area 261a disposed on the first housing 210, a second area 261b disposed on the second housing 220, and a flexible area 261c between the first area 261a and the second area 261b, and a PCB 570 disposed on the first housing (e.g., 210 or 520) and having an overlap region A1 that overlaps the coupling region 522 and a non-overlap region A2 that does not overlap the coupling region 522. The PCB 570 may include a plurality of metal layers 571 and a plurality of lines 574, and the PCB 570 may include a void portion 575 in which a portion of at least one metal layer (e.g., 571b and 571c) close to the coupling region 522 among the plurality of metal layers 571 is not formed, in the non-overlap region A2.

In one or more example embodiments, the void portion 575 may not be disposed in a metal layer 571a that is farthest from the coupling region 522 among the plurality of metal layers 571.

In one or more example embodiments, the void portion 575 may be disposed only in the metal layer 571c that is closest to the coupling region 522 among the plurality of metal layers 571, in the non-overlap region A2.

In one or more example embodiments, the plurality of lines 574 may be formed in both the overlap region A1 and the non-overlap region A2.

In one or more example embodiments, an electronic device (e.g., 501 or 601) may further include an antenna 680 including a ground portion, and the ground portion may be electrically connected to the metal layer 571c closest to the coupling region 522 among the plurality of metal layers 571.

In one or more example embodiments, the electronic device (e.g., 501 or 601) may further include the antenna 680, a housing 620 may include an accommodating portion 627 configured to accommodate the antenna 680, and a coupling region 622 may be located on a boundary 6271 of the accommodating portion 627.

According to one or more example embodiments, an electronic device 701 may include a housing 720 having a coupling region 722, and a PCB 770 having an overlap region A1 that overlaps the coupling region 722 and a non-overlap region A2 that does not overlap the coupling region 722. The PCB (e.g., 570 or 770) may include a plurality of metal layers (e.g., 571 or 771) and a plurality of lines 574, and the PCB 770 may include a void portion 775 in which a portion of at least one metal layer (e.g., 771b and/or 771c) close to the coupling region 722 among the plurality of metal layers 771 is not formed.

In one or more embodiments, the void portion 775 may be disposed over at least a portion of the overlap region A1 and at least a portion of the non-overlap region A2.

While various example embodiments have been particularly shown and described, it will be understood that various changes in form and details may be made therein without departing from the spirit and scope of the following claims.

What is claimed is:

1. An electronic device comprising:
   a housing comprising a coupling region; and
   a printed circuit board (PCB) comprising:
   an overlap region that overlaps the coupling region;
   a non-overlap region that does not overlap the coupling region;
   a plurality of metal layers comprising a plurality of lines; and
   a void portion in which a portion of at least one metal layer, among the plurality of metal layers, is not formed so that the at least one metal layer is discontinuous or terminated in the void portion, the at least one metal layer including a metal layer that is closest to the coupling region among the plurality of metal layers.

2. The electronic device of claim 1, wherein the at least one metal layer does not include a metal layer that is farthest from the coupling region among the plurality of metal layers.

3. The electronic device of claim 1, wherein the void portion is in the non-overlap region, and the at least one metal layer includes only the metal layer that is closest to the coupling region.

4. The electronic device of claim 1, wherein the plurality of lines is provided in both the overlap region and the non-overlap region.

5. The electronic device of claim 1, further comprising:
   an antenna comprising a ground portion,
   wherein the ground portion is electrically connected to the metal layer that is closest to the coupling region among the plurality of metal layers.

6. The electronic device of claim 1, further comprising:
   an antenna,
   wherein the housing comprises an accommodating portion configured to accommodate the antenna,
   wherein the coupling region is at a boundary of the accommodating portion.

7. The electronic device of claim 1, wherein the plurality of lines are lines through which signals pass.

8. The electronic device of claim 1, further comprising:
   an antenna comprising a ground portion that is connected to the plurality of lines or forms at least a portion of the plurality of lines.

9. The electronic device of claim 1, wherein the housing has a bottom surface comprising the coupling region and a non-coupling region that is different from the coupling region, and
   wherein the housing further comprises a protruding rib that protrudes from the coupling region of the bottom surface and contacts the PCB.

10. The electronic device of claim 9, wherein the housing further comprises:
    a hole formed on the protruding rib; and
    a fixing member coupled to the hole and configured to fix the PCB to the protruding rib.

11. The electronic device of claim 9, wherein the protruding rib comprises a burr contacting the metal layer that is closest to the coupling region.

12. The electronic device of claim 1, wherein the PCB further comprises at least one dielectric layer on or under at least one metal layer among the plurality of metal layers.

13. The electronic device of claim 1, wherein the void portion is in the non-overlap region.

14. The electronic device of claim 1, wherein the void portion is in at least a portion of the overlap region and at least a portion of the non-overlap region.

15. The electronic device of claim 1, wherein the housing further comprises a first housing comprising the coupling region and a second housing, and
    wherein the electronic device comprises:
    a hinge structure connecting the first housing and the second housing; and
    a display comprising a first area disposed in the first housing, a second area disposed in the second housing, and a flexible area between the first area and the second area.

* * * * *